United States Patent [19]
Lin et al.

[11] Patent Number: 5,770,510
[45] Date of Patent: Jun. 23, 1998

[54] METHOD FOR MANUFACTURING A CAPACITOR USING NON-CONFORMAL DIELECTRIC

[75] Inventors: Yeh-Sen Lin, Tao-Yuan; Chao-Ming Koh, Hsinchu, both of Taiwan

[73] Assignee: Vanguard International Semiconductor Corporation, Hsinchu, Taiwan

[21] Appl. No.: 760,945

[22] Filed: Dec. 9, 1996

[51] Int. Cl.⁶ ................................................. H01L 21/20
[52] U.S. Cl. .......................... 438/396; 438/254; 438/253; 438/397
[58] Field of Search ................................. 438/253, 254, 438/396, 397

[56] References Cited

U.S. PATENT DOCUMENTS

| | | | |
|---|---|---|---|
| 5,104,821 | 4/1992 | Choi et al. | 438/396 |
| 5,223,083 | 6/1993 | Cathey et al. | 438/396 |
| 5,460,996 | 10/1995 | Ryou | 438/397 |
| 5,468,671 | 11/1995 | Ryou | 438/397 |
| 5,488,011 | 1/1996 | Figura et al. | 438/396 |
| 5,492,850 | 2/1996 | Ryou | 438/396 |
| 5,663,093 | 9/1997 | Tseng et al. | 438/396 |

*Primary Examiner*—Charles L. Bowers, Jr.
*Assistant Examiner*—Lynne A. Gurley
*Attorney, Agent, or Firm*—Christensen, O'Connor Johnson & Kindness PLLC

[57] ABSTRACT

A method of forming a capacitor on a semiconductor substrate includes forming a first oxide layer on the semiconductor substrate. A contact hole is then formed in the first oxide layer. A first conductive layer is formed on the first oxide layer and in the contact hole. Then the first conductive layer is etched to form a node structure. A non-conformal oxide is formed on the node structure so that the non-conformal oxide has an overhang portion and a lower portion on the sidewall of the node structure. The non-conformal oxide is isotropically etched to remove the lower portion of the non-conformal oxide and to expose the lower sidewall of the node structure. A second conductive layer is conformally deposited on the non-conformal oxide layer and the lower sidewall of the node structure. The second conductive layer is anisotropically etched, using the overhang portion of the non-conformal oxide as a mask. Then the non-conformal oxide is removed by using a highly selective etching process. The resulting conductive structure serves as a bottom storage node of the capacitor. A dielectric film is formed on the first conductive layer and the second conductive layer. A third conductive layer is formed over the dielectric film to form the top storage node of the capacitor.

25 Claims, 5 Drawing Sheets

METHOD FOR MANUFACTURING A CAPACITOR USING NON-CONFORMAL DIELECTRIC

FIELD OF THE INVENTION

The present invention relates to methods of fabricating a semiconductor device, and more specifically, to methods of forming a Dynamic Random Access Memory (DRAM) cell. Still more particularly, the present invention relates to methods of forming a DRAM cell capacitor using non-conformal dielectric layers.

BACKGROUND

Dynamic Random Access Memories are so named because their cells can retain information only temporarily, even with power continuously applied. The cells must therefore be read and refreshed at periodic intervals. The advantages of cost per bit, device density, and flexibility of use have made DRAMs the most widely used form for semiconductor memory to date.

An integrated circuit DRAM device typically has many memory cells. Indeed, a memory cell is provided for each bit stored by the DRAM device. Each memory cell typically consists of a storage capacitor and an access transistor. Either the source or drain of the access transistor is connected to one terminal of the capacitor. The other side of the transistor's channel and the transistor gate electrode are connected to external connection lines called a bit line and a word line, respectively. The other terminal of the capacitor is connected to a reference voltage. The formation of a DRAM memory cell includes the formation of a transistor, a capacitor and contacts to external circuits. The capacitor type that has been typically used in DRAM memory cells are planar capacitors, because they are relatively simple to manufacture. The planar capacitor structure used in the one-transistor DRAM cell is used up to the 256-kbit DRAM generation.

It has been the trend in integrated circuit technology to increase the density of semiconductor devices per unit area of silicon wafer. However, this reduction in size can cause performance problems, especially for integrated circuit DRAM memory cells that use planar capacitors. In order to achieve high density DRAM devices, the memory cells must be scaled down in size to the submicrometer range. This causes reduction in capacitor area, resulting in the reduction of cell capacitance. In this case, because the area of the charge storage capacitor is also decreased, the capacitance becomes relatively small. This decrease in storage capacitance leads to lowered signal-to-noise ratios and increased errors due to alpha particle interference.

Accordingly, for very small memory cells, planar capacitors become very difficult to use reliably. Additionally, as the capacitance decreases, the charge held by storage capacitor must be refreshed often. A simple stacked planar capacitor generally cannot provide sufficient capacitance for good performance, even with high performance dielectrics, such as $Ta_2O_5$.

Prior art approaches to overcoming these problems have resulted in the development of the trench capacitor (see for example U.S. Pat. No. 5,374,580) and the stacked capacitor (see for example U.S. Pat. No. 5,021,357). The trench capacitor has the well known problem of "gated diode leakage". Reducing the thickness of the dielectric also can improve the capacitance of the capacitor, but this approach is limited because of yield and reliability problems.

In another method, a capacitor over bit line (COB) cell with a hemispherical-grain (HSG—Si) polysilicon storage node has been developed (see "A CAPACITOR OVER BIT LINE CELL WITH HEMISPHERICAL-GRAIN STORAGE NODE FOR 64 Mb DRAMs", M. Sakao et al., Microelectronics Research Laboratories, NEC Corporation). This method uses a capacitor that is formed by a HSG—Si "seeding method" to increase the area of the capacitor. Yet another prior capacitor cell has been disclosed in U.S. Pat. No. 5,302,540. This patent discloses a capacitor having a first conductive layer with a plurality of cylindrical sections, a dielectric layer over the first conductive layer, and a second conductive layer formed over the dielectric layer. However, these types of approaches are relatively complex for use in a commercial fabrication process.

SUMMARY

In accordance with the present invention, a method of manufacturing a capacitor is provided. In one embodiment adapted for use in a DRAM cell, a substrate having a transistor, a bit line and a word line formed therein and thereon is provided. A first dielectric layer is then formed on the substrate.

A contact hole is formed in the first dielectric layer, exposing a portion of a source/drain (S/D) region of the transistor. A first conductive layer is then formed on the first dielectric layer and in the contact hole. The first conductive layer is preferably a doped polysilicon layer.

Afterwards, a photoresist is patterned on the first conductive layer, covering portions of the top surface of the first conductive layer to define capacitor storage nodes. An etching process is performed to etch the first conductive layer using the photoresist as an etching mask. As a result of this etching process, a trench is defined by the sidewalls of the capacitor nodes of adjacent DRAM memory cells.

Next, the photoresist is removed and a non-conformal oxide layer is formed by plasma enhanced chemical vapor deposition (PECVD) on the first conductive layer and on the first dielectric layer. Because a non-conformal process is used, the portions of the oxide layer on the sidewalls of the trench between each pair of capacitor nodes has poor step coverage. More specifically, these portions of the oxide layer form "overhangs" in the trench, with the portions of the oxide layer on the lower sidewalls of the trench being significantly thinner than the overhang. A wet etching is then performed on the non-conformal oxide layer, completely removing portions of the non-conformal oxide layer on the lower sidewalls of the trench.

Then a second conductive layer is conformally formed on the non-conformal oxide. Because the portions of the oxide layer on the lower portions of the trench are completely removed, the second conductive layer contacts the lower sidewalls of the capacitor nodes. Then an isotropic etching process is used to etch the upper portion of the second conductive layer and to separate two electrodes. The lower portions of the second conductive layer contacting the sidewalls of the capacitor node are masked by the overhang of the non-conformal oxide. The residual portions of the second conductive layer form upwardly extending fins on the capacitor node. The non-conformal oxide layer is then removed using an etching process having a high selectivity between the oxide and the polysilicon, leaving the structure formed by the first and second conductive layers intact. The resulting polysilicon structure serves as the bottom electrode of the capacitor, which has a relatively large surface area due to the upwardly extending fins. A dielectric film is then conformally deposited on the first and second polysilicon layers, serving as the capacitor dielectric. A third conductive layer is then deposited on the dielectric film to serve as the top electrode of the capacitor.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

In the present invention, a new method is disclosed to fabricate a DRAM cell capacitor by using a non-conformal dielectric. The formation of the DRAM cell includes many process steps that are well known in the art. For example, the process of photolithography masking and etching is used extensively in several embodiments of the present invention. One standard photolithography process includes creating a photolithography mask containing the pattern of the component to be formed, coating the wafer with a light sensitive material known as a photoresist, exposing the photoresist coated wafer to ultra-violet light through the mask to soften or harden parts of the photoresist (depending on whether positive or negative photoresist is used), removing the softened parts of the photoresist, etching to remove the materials left unprotected by the photoresist and then stripping the remaining photoresist. This photolithography masking and etching process is referred to herein as "patterning and etching."

Figure 1:
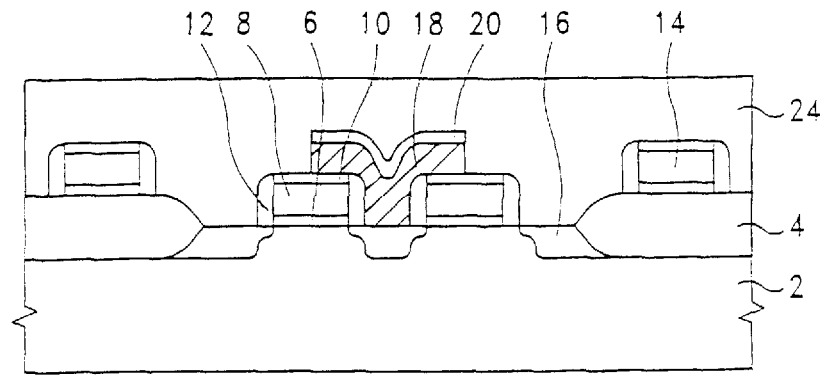
FIG. 1 is a cross-sectional view of a semiconductor wafer illustrating the steps of forming a gate structure and an isolation layer on a substrate, according to one embodiment of the present invention.

Referring to FIG. 1, a single crystal silicon substrate 2 with a <100> crystallographic orientation is provided. Transistors, word lines and bit lines are formed in and on the substrate 2 in any suitable manner. In one embodiment, the transistor, word lines and bit lines are formed as follows.

Thick field oxide (FOX) regions 4 are formed to provide isolation between devices on the substrate 2. The FOX regions 4 are created in a conventional manner. For example, the FOX regions 4 can be formed via photolithography and dry etching steps to etch a silicon nitride-silicon dioxide composition layer. After the photoresist is removed and the substrate wet cleaned, the FOX regions 4 are grown in an in an oxygen-steam environment, at a temperature between 850°–1050° C., to a thickness of about 4000–6000 angstroms. After the creation of the FOX regions 4, the silicon nitride-silicon dioxide composition layer is removed by using hot phosphoric acid solution for the silicon-nitride layer, and a buffered hydrofluoric acid solution for the silicon-dioxide.

Next, a silicon dioxide layer 6 is created on the top surface of the substrate 2 to serve as the gate oxide for subsequently formed Metal Oxide Silicon Field Effect Transistors (MOSFETs). In this embodiment, the silicon dioxide layer 6 is formed to a thickness about 50–200 angstroms by using an oxygen-steam ambient, at a temperature of about 850°–1000° C. Alternatively, the oxide layer 6 may be formed using any suitable oxide chemical compositions and procedures.

A first polysilicon layer 8 is then formed over the FOX regions 4 and the silicon dioxide layer 6 using a Low Pressure Chemical Vapor Deposition (LPCVD) process at a temperature about 600°–800° C. The first polysilicon layer 8 is doped in order to form a conductive gate for the MOSFET structure. In this embodiment, the first polysilicon layer 8 has a thickness of about 500–3500 angstroms and is doped with phosphorous or arsenic dopants at a concentration of about $1E20-1E21$ atoms/cm$^3$. The polysilicon layer 8 can also be formed using an in-situ doping process. A capped oxide layer 10 is formed on the first polysilicon layer 8 to a thickness about 500–1200 angstroms using CVD. Next, standard photolithography and etching process are performed to form a gate structure and a word line 14. Sidewall spacers 12 are subsequently formed on the sidewalls of the first polysilicon layer. Thereafter, active regions 16 (i.e., the MOSFET's source and drain) are formed, using well known processes to implant appropriate impurities in those regions and activate the impurities. In view of this disclosure, those skilled in the art of DRAM fabrication can modify this embodiment to form lightly doped drain (LDD) structures, without undue experimentation.

A metal layer 18 is then deposited on the gate structure and the substrate 2. A silicide layer 20, such as tungsten silicide, is subsequently formed on the metal layer. The metal layer 18 and the tungsten silicide layer 20 are then patterned and etched to form a bit line. In the preferred embodiment, the thickness of the metal layer is about 500–2000 angstroms, and the thickness of the tungsten silicide 20 is about 1000–3000 angstroms.

A first dielectric layer 24 is then formed on the bit line 22, the gate structure and the substrate 2 using a standard CVD process. This first dielectric layer 24 is preferably about 4000 angstroms thick, but any thickness in the range of 3000 to 6000 angstroms can be used. The first dielectric layer 24 provides isolation for the transistor, bit line structures and a capacitor. The first dielectric layer 24 can be formed of any suitable material such as, for example, silicon oxide.

Figure 2:
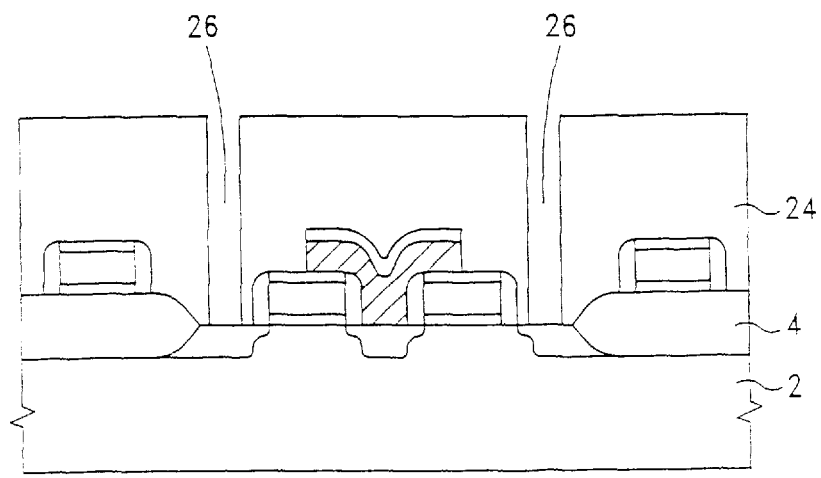
FIG. 2 is a cross-sectional view of a semiconductor wafer illustrating the steps of forming a contact hole in the isolation layer, according to one embodiment of the present invention.

As shown in FIG. 2, contact holes 26 are then formed through the first dielectric layer 24 to expose a portion of one of the source/drain (S/D) regions 16. In this embodiment, the first dielectric layer 24 is made of TEOS or BPSG, and a standard dry etching process is used to anisotropically etch the first dielectric layer 24 to form the contact hole 26.

Figure 3:
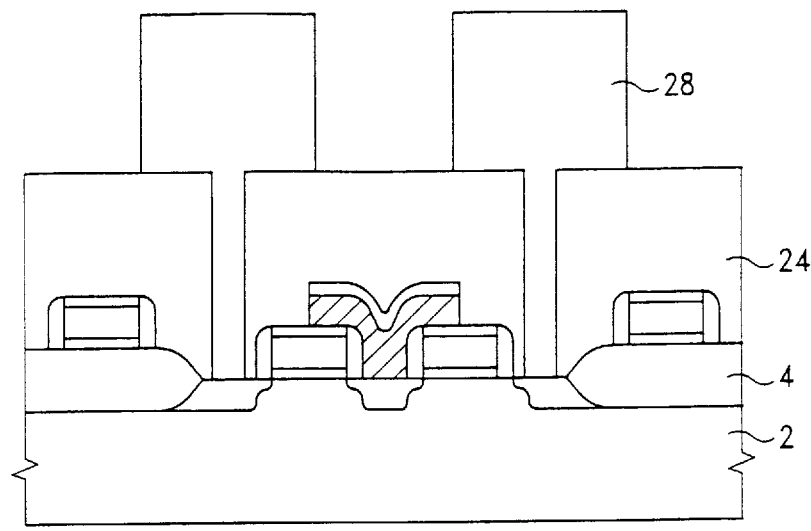
FIG. 3 is a cross-sectional view of a semiconductor wafer illustrating the steps of forming a second polysilicon layer on the substrate, according to one embodiment of the present invention.

Turning to FIG. 3, a second polysilicon layer 28 is then formed on the first dielectric layer 24 and in the contact holes 26. The second polysilicon layer 28 preferably completely fills the contact holes 26. In the preferred embodiment, the second polysilicon layer 28 is formed using conventional LPCVD processing. The thickness of the second polysilicon layer 28 on the top surface of the first dielectric layer 24 is about 4000–8000 angstroms. The second polysilicon layer 28 is doped with phosphorous or arsenic dopants with a concentration of about 1E20–1E21 atoms/cm$^3$ to increase conductivity. Any suitable method may be used to dope the polysilicon such as, for example, in-situ doping. Then a photoresist is patterned on the polysilicon layer 28, forming etching masks over the contact holes 26 to define capacitor nodes. Afterward, a reactive ion etching (RIE) process is used to anisotropically etch the unmasked portions of the second polysilicon layer 28 to the surface of the first dielectric layer 24, forming the capacitor nodes. The sidewalls of adjacent capacitor nodes define a trench. Then the photoresist is stripped away. In this embodiment, this RIE process uses a $SF_6+HBr+O_2$ chemistry etchant. The resulting structure is shown in FIG. 3.

Figure 4:
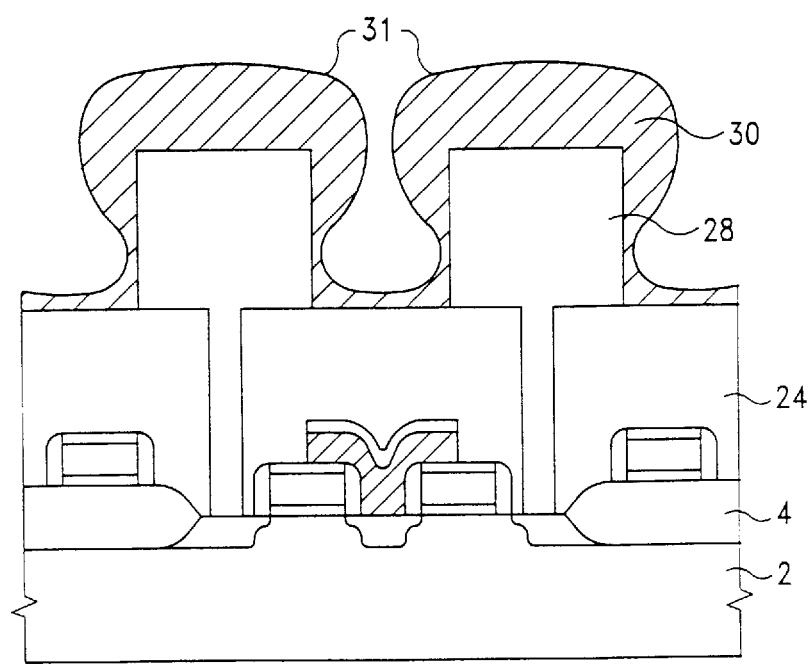
FIG. 4 is a cross-sectional view of a semiconductor wafer illustrating the step of forming a non-conformal dielectric layer on the substrate, according to one embodiment of the present invention.

Referring to FIG. 4, a non-conformal dielectric layer 30 is deposited on the first dielectric layer 24 and the second polysilicon layer 28. In this embodiment, the non-conformal dielectric layer 30 is formed by plasma enhanced chemical vapor deposition (PECVD) to deposit an oxide layer having a thickness of about 500–3000 angstroms. Because a non-conformal process is used, dielectric layer 30 forms overhangs 31 in the trench between adjacent capacitor nodes. Moreover, the portions of the non-conformal dielectric layer 30 on the bottom surface (i.e., the first dielectric layer 24) and the lower portions of the trench (i.e., the sidewalls of the capacitor nodes formed by the second polysilicon layer 28) are significantly thinner than the overhangs 31.

Figure 5:
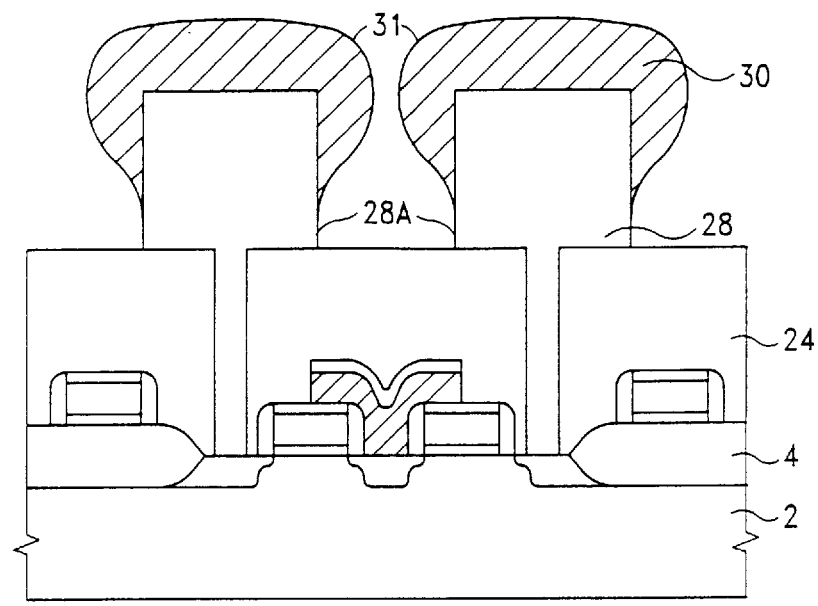
FIG. 5 is a cross-sectional view of a semiconductor wafer illustrating the steps of etching the non-conformal dielectric layer to expose the lower portion of the second polysilicon layer, according to one embodiment of the present invention.

Next, as seen in FIG. 5, the lower portions of the non-conformal layer 30 (i.e., beneath the overhangs 31) are removed. In this embodiment, a HF wet etching process is performed to attack the non-conformal dielectric layer 30, thereby exposing the top surface of the dielectric layer 24 and the lower portions 28A of the second polysilicon layer 28 between adjacent capacitor nodes. In this embodiment, the exposed lower portions 28A of the second polysilicon layer 28 extend upwardly about 500 to 1000 angstroms from the top surface of the first dielectric layer 24. The etching time is controlled to ensure that the lower portions of the dielectric layer 30 on the lower sidewalls of the polysilicon 28 between adjacent capacitor nodes are totally removed.

Figure 6:
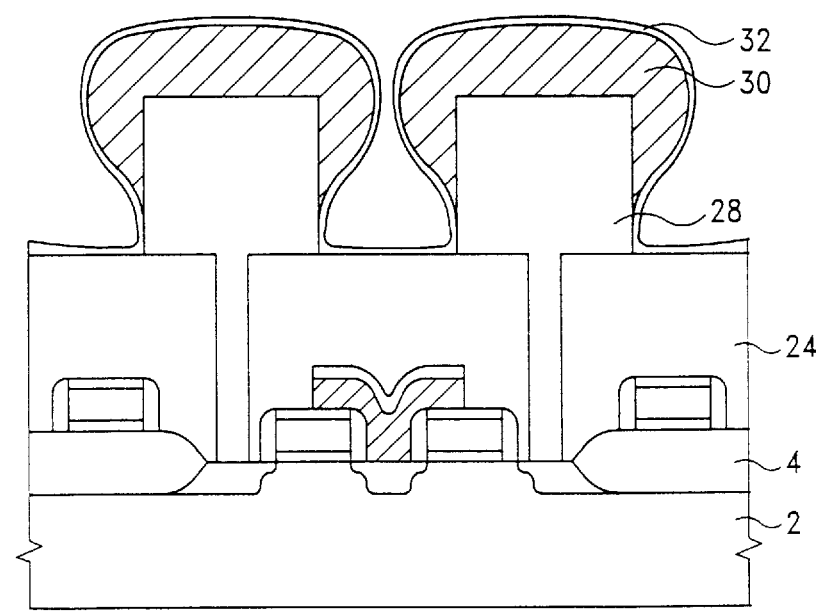
FIG. 6 is a cross-sectional view of a semiconductor wafer illustrating the step of forming a third polysilicon layer on the substrate, according to one embodiment of the present invention.

Turning to FIG. 6, a third polysilicon layer 32 is conformally formed to a thickness of about 300–1000 angstroms on the structure of FIG. 5 using a standard LPCVD process. More specifically, the third polysilicon layer 32 conformally contacts the non-conformal dielectric layer 30, the lower portions 28A (FIG. 5) of the second polysilicon 28 layer and on the first dielectric layer 24 between adjacent capacitor nodes. Similarly, the third polysilicon layer 32 is preferably of doped polysilicon with the same dopants and concentration of the second polysilicon layer 28.

Figure 7:
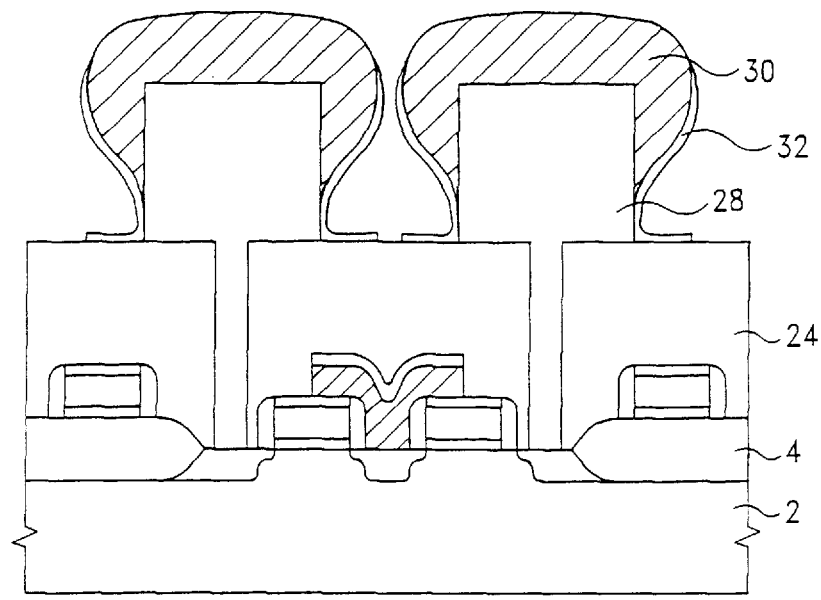
FIG. 7 is a cross-sectional view of a semiconductor wafer illustrating the step of etching the upper portion of the third polysilicon using the non-conformal dielectric layer as a mask, according to one embodiment of the present invention.

As shown in FIG. 7, portions of the third polysilicon layer 32 are then removed. In this embodiment, the third polysilicon layer 32 is anisotropically etched to remove the upper portions (i.e., above the overhangs 31) of the third polysilicon layer 32 and, in addition, a portion of the third polysilicon layer 32 between adjacent capacitor nodes left uncovered by the overhangs 31. This anisotropic etching process serves to separate the two capacitor nodes or electrodes and to leave intact residual portions of the third polysilicon 32 below the overhangs 31. This etching process can be any suitable process such as, for example, RIE etching process using $SF_6$, $HBr+O_2$ or $HBr+O_2+Cl_2$ chemistry etchants.

Figure 8:
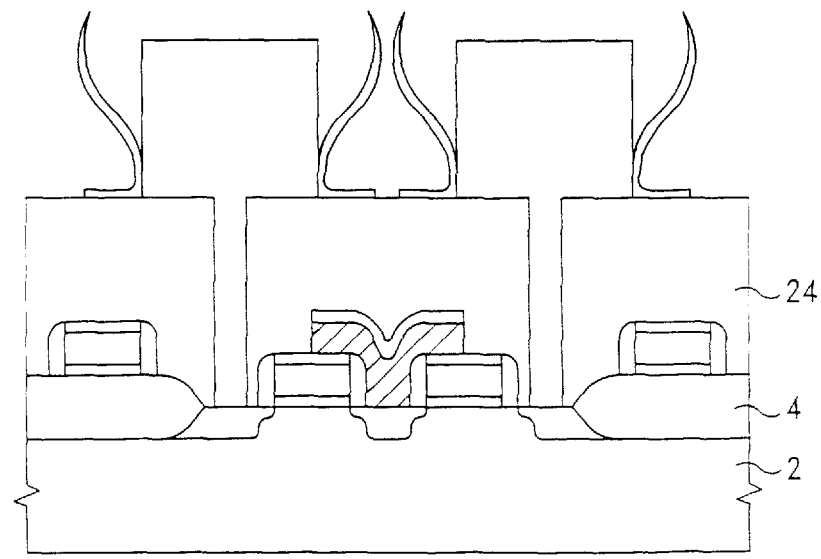
FIG. 8 is a cross-sectional view of a semiconductor wafer illustrating the step of removing the non-conformal dielectric layer, according to one embodiment of the present invention.

Referring to FIG. 8, the non-conformal dielectric layer 30 is then removed, leaving the polysilicon structures formed by the polysilicon layers 28 and 32 intact. These polysilicon structures serve as the bottom nodes or electrodes of integrated circuit capacitors. Preferably, an etching process having a high etching selectivity between oxide and polysilicon (e.g., having a selectivity ratio of about 100-to-1 or greater) is used. In this embodiment, the etching process uses an HF etchant to attack the silicon dioxide of the non-conformal dielectric layer 30 while not affecting the integrity of the polysilicon structure. In addition, the structure formed by the polysilicon layer 32 for each electrode adds more surface area to the electrode, thereby increasing the capacitance of the capacitor.

Figure 9:
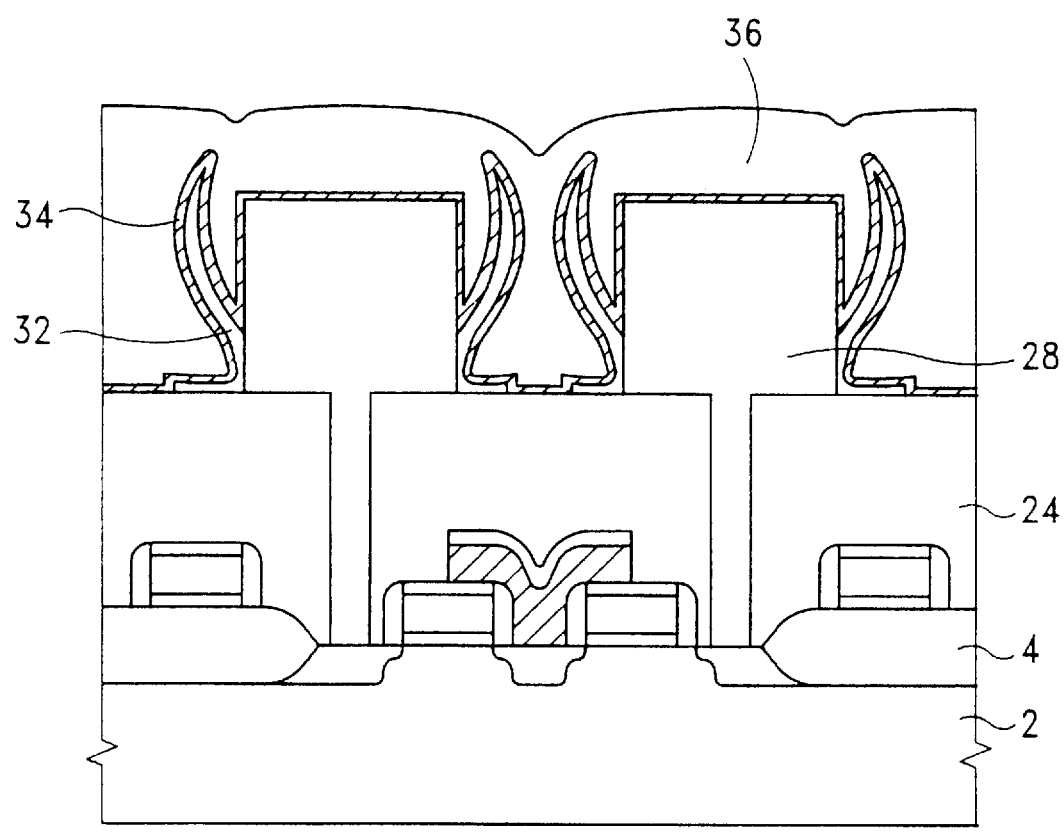
FIG. 9 is a cross-sectional view of a semiconductor wafer illustrating the steps of forming a dielectric film and a third polysilicon layer, according to one embodiment of the present invention.

Turning to FIG. 9, a second dielectric layer 34 is then conformally deposited on bottom electrode formed by the second and third polysilicon layers 28 and 32. The second dielectric film 34 can be formed of a nitride/oxide double-film, an oxide/nitride/oxide triple-film, or any other high dielectric film such as tantalum oxide ($Ta_2O_5$). Afterwards, a fourth polysilicon layer 36 is deposited on the second dielectric layer 36 using a conventional LPCVD process. Preferably, the fourth polysilicon layer 36 is doped in the same manner as the second polysilicon layer 28. The fourth polysilicon layer 36 is then patterned and etched to form top storage electrodes for the capacitors. Accordingly, a semiconductor capacitor is formed which has relatively large electrode surface area while occupying a relatively small area of the substrate. Therefore, a capacitor according to the present invention has a relatively large capacitance, thereby supporting good performance and high density. In addition, the use of a non-conformal dielectric layer simplifies and reduces the cost of the fabrication process.

As will be understood by persons skilled in the art, the foregoing embodiments of the present invention are illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

The embodiments of the invention in which an exclusive property or privilege is claimed are defined as follows:

1. A method of forming a capacitor on a semiconductor substrate, said method comprising:

forming a first dielectric layer over said semiconductor substrate;

forming a contact hole in said first dielectric layer, exposing a portion of said substrate;

forming a first conductive layer over said first dielectric layer, wherein said first conductive layer fills said contact hole and contacts the exposed portion of said substrate;

patterning a photoresist on said first conductive layer to cover a portion of said first conductive layer over said contact hole;

removing portions of said first conductive layer not covered by said photoresist;

stripping said photoresist;

forming a non-conformal dielectric layer on said first conductive layer and said first dielectric layer, wherein said non-conformal dielectric layer includes an overhang portion and a lower portion on a sidewall of said first conductive layer;

removing said lower portion of said non-conformal dielectric to expose a lower portion of the sidewall of said first conductive layer;

forming a second conductive layer on said non-conformal dielectric layer, said lower portion of the sidewall of said first conductive layer and on said first dielectric layer;

removing portions of said second conductive layer not covered by said overhang portion of said non-conformal dielectric layer;

removing said non-conformal dielectric layer while leaving said first and second conductive layers intact, wherein said first and second conductive layers form a bottom storage node of said capacitor;

forming a dielectric film on said first conductive layer and said second conductive layer; and forming a third conductive layer on said dielectric film, wherein said third conductive layer serves as a top storage node of said capacitor.

2. The method of claim 1, wherein said first dielectric layer comprises silicon dioxide.

3. The method of claim 2, wherein said first dielectric layer is formed to have a thickness of approximately 3000 to 6000 angstroms.

4. The method of claim 1, wherein said first conductive layer comprises doped polysilicon.

5. The method of claim 4, wherein said first conductive layer comprises in-situ doped polysilicon.

6. The method of claim 1, wherein said removing said non-conformal dielectric layer while leaving said first and second conductive layers intact comprises using an etchant including HF.

7. The method of claim 1, wherein said second conductive layer comprises a conformal doped polysilicon layer.

8. The method of claim 7, wherein said second conductive layer has a thickness in a range of about 300 to 1000 angstroms.

9. The method of claim 7, wherein said second conductive layer comprises in-situ doped polysilicon.

10. The method of claim 1, wherein said third conductive layer comprises doped polysilicon.

11. The method of claim 1, wherein said non-conformal dielectric layer comprises silicon dioxide.

12. The method of claim 11, wherein said non-conformal dielectric layer has a thickness of approximately 500 to 3000 angstroms.

13. The method of claim 11, wherein said non-conformal dielectric layer is formed by PECVD.

14. The method of claim 1, wherein removing portions of said second conductive layer not covered by said overhang portion of said non-conformal dielectric layer comprises anisotropically etching said second conductive layer.

15. The method of claim 1, wherein said dielectric film comprises tantalum oxide ($Ta_2O_5$).

16. The method of claim 1, wherein said dielectric film comprises an oxide/nitride/oxide triple-film.

17. The method of claim 1, wherein said dielectric film comprises a nitride/oxide double-film.

18. The method of claim 1, wherein before forming said first dielectric layer on said semiconductor substrate, said method further comprises:

forming a field oxide (FOX) region on said substrate;

forming a silicon dioxide layer on said substrate, said silicon dioxide layer serving as a gate oxide for a transistor;

forming a fourth conductive layer over said FOX region and said silicon dioxide layer;

patterning and etching said fourth conductive layer to form a gate structure for said transistor;

forming a cap layer on said fourth conductive layer;

doping selective regions of said substrate to form source and drain regions in said substrate for said transistor;

forming a metal layer on said gate structure and on said substrate;

forming a silicide layer on said metal layer; and patterning and etching said metal layer and said silicide layer to form a bit line.

19. A method of forming a polysilicon structure on a semiconductor substrate, said method comprising:

forming a first polysilicon layer on said substrate;

patterning a photoresist on said first polysilicon layer to cover a portion of said first doped polysilicon layer;

anisotropically etching said first conductive layer using said photoresist as a mask, wherein said first conductive layer has a residual portion above said substrate, said residual portion having a sidewall;

stripping said photoresist;

forming a non-conformal oxide layer on said residual portion of said first polysilicon layer and said substrate, wherein said non-conformal oxide layer has an overhang portion on said sidewall and a lower portion on said sidewall;

removing said lower portion of said non-conformal oxide layer to expose a lower portion of said sidewall;

forming a second polysilicon layer on said non-conformal oxide layer, said lower portion of said sidewall and said first dielectric layer;

removing portions of said second polysilicon layer not covered by said overhang portion of said non-conformal oxide layer; and removing said non-conformal oxide layer while leaving said first and second polysilicon layers intact.

20. The method of claim 19, wherein said first polysilicon layer is deposited to have a thickness in a range of about 4000 to 8000 angstroms.

21. The method of claim 19, wherein said second polysilicon layer is conformally deposited to have a thickness in a range of about 300 to 1000 angstroms.

22. The method of claim 19, wherein said non-conformal oxide layer is deposited using a PECVD process to have a thickness of about 500 to 3000 angstroms.

23. The method of claim 19, wherein removing portions of said second polysilicon layer not covered by said overhang portion of said non-conformal oxide layer comprises anisotropically etching said second polysilicon layer.

24. The method of claim 19, wherein removing said lower portion of said non-conformal oxide layer comprises isotropically etching said non-conformal oxide layer using a wet etching process with an HF etchant.

25. The method of claim 19, wherein removing said non-conformal oxide layer while leaving said first and second polysilicon layers intact comprises isotropically etching said non-conformal oxide layer using an HF etchant.

* * * * *